United States Patent [19]

Sato et al.

[11] Patent Number: 5,660,628
[45] Date of Patent: Aug. 26, 1997

[54] METHOD OF MANUFACTURING SEMICONDUCTOR EPITAXIAL WAFER

[75] Inventors: Tadashige Sato, Tsuchiura; Hitora Takahashi, Ushiku, both of Japan

[73] Assignee: Mitsubishi Kasei Corp., Tokyo, Japan

[21] Appl. No.: 291,997

[22] Filed: Aug. 18, 1994

[30] Foreign Application Priority Data

Aug. 18, 1993 [JP] Japan .................. 5-204228

[51] Int. Cl.$^6$ .................................. C30B 25/02
[52] U.S. Cl. .................. 117/84; 117/86; 117/89; 117/104; 117/108; 117/101; 427/283
[58] Field of Search .................. 117/83, 84, 86, 117/89, 104, 108; 427/283; 437/108, 126, 233

[56] References Cited

U.S. PATENT DOCUMENTS

| 4,422,888 | 12/1983 | Stutius ................ 148/175 |
| 4,526,809 | 7/1985 | Hall et al. ............... 117/84 |

FOREIGN PATENT DOCUMENTS

| 0176998A | 9/1985 | Japan ................ 117/84 |
| 2092899A | 4/1990 | Japan ................ 117/89 |

OTHER PUBLICATIONS

"Properties of ZnSe/ZnS grown by MOVPE on a rotating substrate";Joerg, et al, Proc. SPIE–Int. Soc. Opt. Eng. (1991), 1361 (Phys. Concepts Mater. Novel Optoelectron, Devive Appl. 1, Pt. 2), pp. 963–971.

"Epitaxial Zinc Sulfide layers"; Kh, et al.; Izv. Khiu. (1976), 9(3), pp.484–495.

"Direct Synthesis of epitaxial Zinc Sulfide layers on zinc single crystal substrates"; Nanev, K. et al; Thin Solid Films (1976), 35(2), 155–163.

K.K. Schuegraf "Handbook of thin–film deposition processes and techniques". (1988), p. 56.

*Primary Examiner*—Felisa Garrett
*Attorney, Agent, or Firm*—Armstrong, Westerman, Hattori, McLeland & Naughton

[57] ABSTRACT

There is provided a method for suppressing generation of cracks or damages on a compound semiconductor epitaxial wafer during an epitaxial growth due to growth of an epitaxial layer on the rear surface at the edge of the epitaxial layer which is located at the upstream side of the flow of the source gas. In manufacturing a semiconductor wafer by growing a single crystal semiconductor epitaxial layer having a zinc blend structure on a single crystal semiconductor substrate having a zinc blend structure, the surface of the single crystal semiconductor substrate has (100) surface orientation having an off angle and a source gas is supplied in the direction of the off angle or in a direction at 30° or less to the direction at 180° thereto.

5 Claims, 2 Drawing Sheets

METHOD OF MANUFACTURING SEMICONDUCTOR EPITAXIAL WAFER

BACKGROUND OF THE INVENTION

1. Field of the Invention

The present invention relates to a method of manufacturing a semiconductor epitaxial wafer.

2. Description of the Related Art

Compound semiconductors have been widely used as materials for optical semiconductor elements, and a material obtained by epitaxially growing a desired layer on a single crystal substrate is used as such a semiconductor material. The reason is that a crystal used as such a substrate is difficult to use as a light emitting element as it is because it has many defects and is relatively impure. Therefore, a layer is epitaxially grown on the substrate, which has a composition such that a desired light emitting wavelength can be obtained. A ternary mixed crystal layer is primarily used as such an epitaxially grown layer. The epitaxial growth is normally in accordance with vapor-phase epitaxy or liquid-phase epitaxy.

Vapor-phase epitaxy which is normally used will be described with reference to FIGS. 1 and 3.

In vapor-phase epitaxy, epitaxial growth is achieved according to a method herein a holder 1 made of graphite or quartz is placed in a reactor 2 made of quartz and a source gas is introduced therein to be heated. On a normal holder, a substrate is positioned at an angle of several degrees to the flow of the gas.

As an example, the growth of a GaAsP epitaxial wafer on a GaP substrate will be described. A GaP substrate is a (100) plane having an orientation flat which is parallel to a cleavage plane of a (0, −1, 1) plane and which is at an angle tilted by 6° in a [0, −1 −1] direction (off angle).

The substrate is normally arranged so that a [0, 1, 01] direction perpendicular to the off angle direction is at the upstream of the gas flow. In the case of GaP, the thickness of the substrate is approximately 300 μm.

There has been a problem in that wafers epitaxially grown using such a method are frequently cracked and/or broken when the temperature is increased or decreased. This is because the source gas directly enters a gap between the substrate and the holder and the epitaxial layer grows at the edge on the rear side of the single crystal substrate. That is, an epitaxial layer of 50–200 μm grows at the edge of the rear side of the wafer during vapor-phase epitaxy. Such an epitaxial layer frequently extends to the plane of the holder and sticks to the surface of the holder and the substrate. When the temperature is returned to the room temperature after the heating process for epitaxial growth, a crack can occur at the sticked area due to a difference in the coefficients of thermal expansion of those parts, which can result in a crack extending over the entire wafer. Further, when a small defective portion remains after epitaxial growth, such a portion has some cracks which cause the wafer to crack during processing on the outer circumference thereof after the epitaxial growth and, as a result, the yield of wafers is reduced.

SUMMARY OF THE INVENTION

Intensive studies were made in order to solve the above-described problem, and the present invention was conceived based on a finding that such a problem can be solved utilizing anisotropy in a growth rate which is a result of the fact that edges of a substrate have various orientations. Specifically, it is an object of the present invention to suppress the generation of cracks or damages on a compound semiconductor epitaxial after during epitaxial growth due to growth of an epitaxial layer at an edge of the rear surface of the epitaxial layer which is located at the upstream side of the flow of the source gas. Such an object is simply achieved in a method of manufacturing a semiconductor wafer by growing a single crystal semiconductor epitaxial layer having a zinc blend structure on a single crystal semiconductor substrate having a zinc-blend structure, wherein the surface of the single crystal semiconductor substrate has (100) surface orientation having an off angle and a source gas is supplied in the direction of the off angle or in a direction at 30° or less to the direction at 180° thereto. The present invention will now be more specifically described.

The present invention is not limited to any particular type of vapor-phase epitaxy, but is applicable to various methods such as thermal analysis, halogen transportation, MOCVD and MBE. It is preferred to use the halogen transportation which is widely used and provides good productivity.

Although any type of substrate can be used for implementation of the present invention as long as it has a zinc blend structure, semiconductor substrates of types such as a gallium arsenide, gallium phosphide and zinc selenide types are preferably used because such substrates have less defects on the surface thereof.

It is essential that the surface of such a substrate has (100) surface orientation including an off angle. If the surface of a substrate has orientation of a low index, the growth rate is decreased. Therefore, to obtain a plane having orientation of a low degree such as (100), a plane which is intentionally tilted from the (100) plane by several degrees is used as the surface on which epitaxial growth takes place. The difference between the angles of the plane of a low degree and the actual surface is referred to as an off angle. In this specification, "the direction of an off angle" means a line along which a plane including a line normal to the (100) plane and a line normal to the actual surface intersect and means the direction from the normal line of the (100) plane at the side of the surface to the actual surface.

The off angle is normally tilted in [011], [01−1], [0−11] and [0−1−1] directions or in [001], [010], [00−1] and [0−10] directions. The preferred off angle depends on directions and the type of the substrate used. For a GaP substrate, the off angle is preferably in the range from 3° to 10° and more preferably in the range from 3° to 7° in [011], [01−1], [0−11] and [0−1−1] directions relative to the (100) plane and in the range from 4° to 15° and more preferably in the range from 5° to 11° in [001], [010], [00−1] and [0−10] directions relative to the (100) plane. For a GaAs substrate, the off angle is preferably in the range from 1° to 7° and more preferably in the range from 1° to 5° in [011], [01−1], [0−11] and [0−1−1] directions relative to the (100) plane and in the range from 1° to 15° and more preferably in the range from 1° to 5° in [001], [010], [00−1] and [0−10] directions relative to the (100) plane.

The advantage of the present invention is most significant when the off angle is in [011] and [0−1−1] directions on a GaP substrate and when the off angle is in [001], [010], [00−1] and [0−10] directions on a GaAs substrate.

The most important feature of the present invention is that a source gas is supplied in the direction of the off angle or in a direction at 30° or less to the direction at 180° thereto during epitaxial growth. The gas is preferably supplied in the direction of the off angle or in a direction at 10° or less to the direction at 180° thereto. Even if a base or the like on which the substrate is placed rotates, it is not necessary to consider the tilt in the direction in which the source is supplied due to the rotation, although the reason is not clear enough. Therefore, if a barrel type reactor is used as shown in FIG. 1, the source is supplied from the upper side of the barrel. If a horizontal reactor as shown in FIG. 2 is used, the source is supplied in the direction of the center of the horizontal plane.

If a substrate is set in such a direction, the off angle direction of the substrate is at the upstream side of the gas flow and, as a result, facet growth occurs on an end face of the epitaxial wafer. This prevents epitaxial growth from extending to the rear side of the substrate at an extraordinary high rate as a result of polycrystalline growth. Therefore, epitaxial growth is suppressed on the rear side of the substrate and, consequently, the substrate and the surface of the holder are not bonded together. This makes it possible to minimize the generation of cracks after epitaxial growth.

Especially, the effect of the present invention becomes more significant, the thicker the epitaxial layer grown on the substrate. In practice, the effect is significant where an epitaxial layer is grown to a thickness of 30 µm or more. As the epitaxial layer to be grown, GaAsP is preferred.

DETAILED DESCRIPTION OF THE PREFERRED EMBODIMENTS

Figure 1:
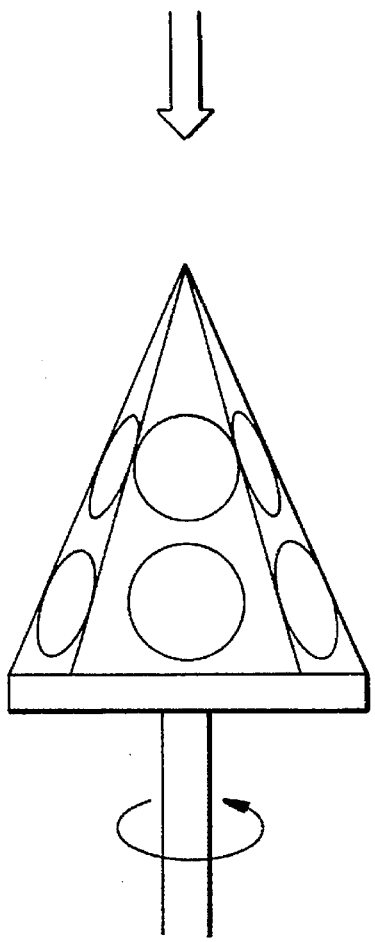
FIG. 1 illustrates an example of a barrel type holder for growing a wafer.
Figure 2:
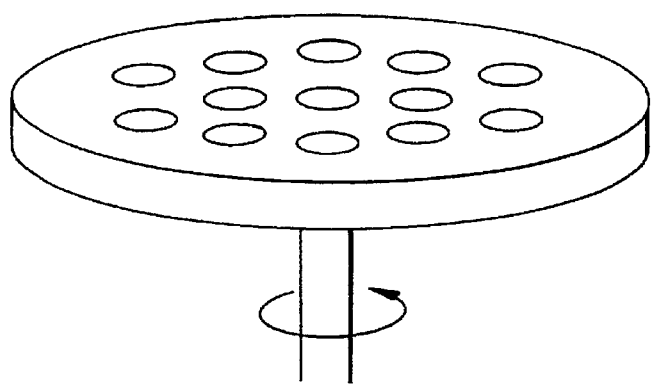
FIG. 2 illustrates an example of a horizontal type holder for growing a wafer.
Figure 3:
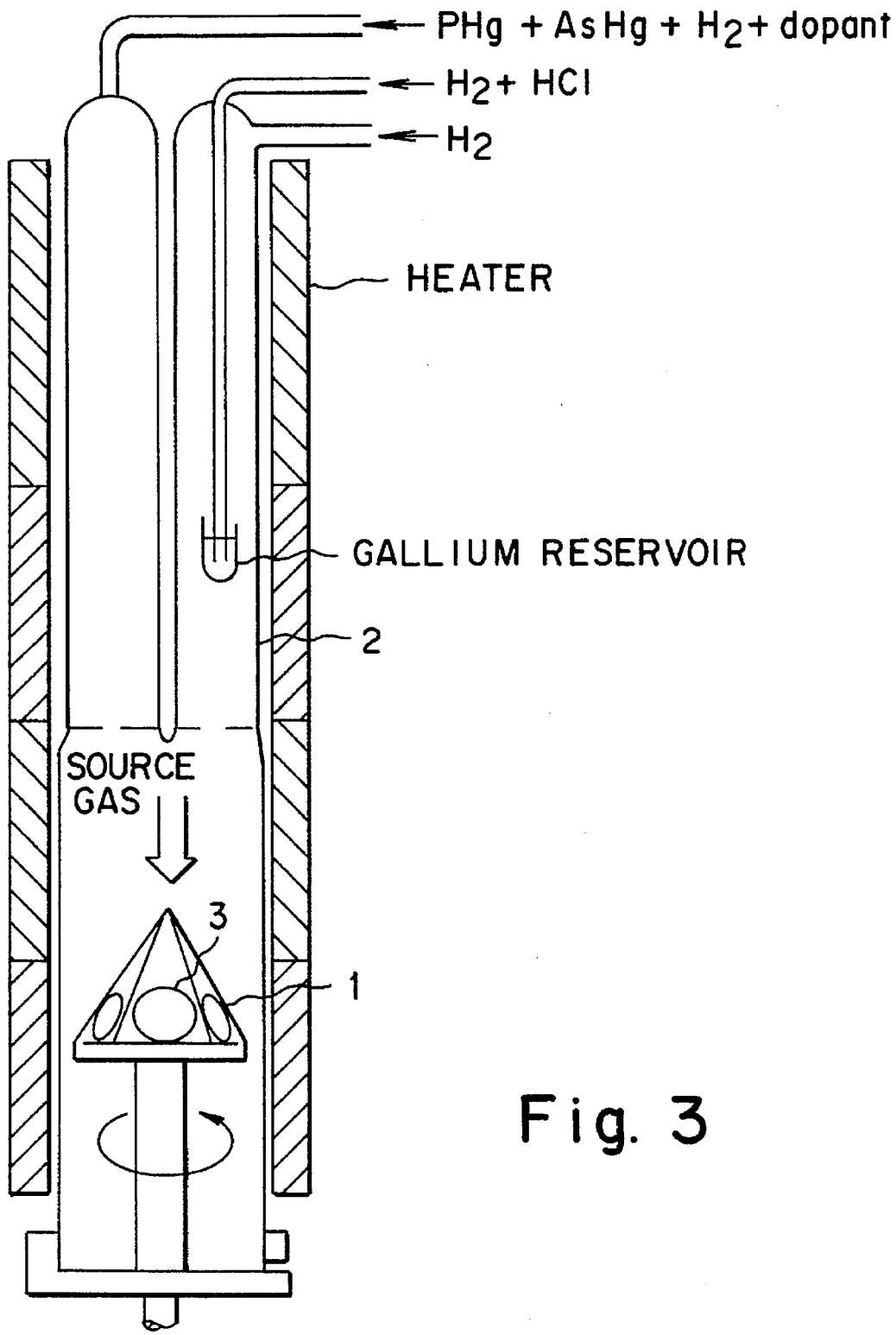
FIG. 3 illustrates an apparatus for growing a wafer.

The present invention will now be described with reference to preferred embodiments thereof. It is to be understood that the present invention is not limited to such embodiments and may be implemented in any other way as long as it falls upon the spirit and scope of the invention.

A first embodiment of the present invention will be described.

A GaP single crystal substrate added with 2 to $10 \times 10^{17}$ atoms/$cm^3$ of sulfur (S) having a crystallographic surface orientation displaced by 6° in a [0-1-1] direction from a (100) plane and high purity Ga were placed in predetermined locations in an epitaxial reactor having a quartz port for storing Ga. A GaP substrate was placed so that the side of the quartz holder toward the upstream of the gas would be in the [0-1-1] direction. The holder was rotated three times per minute. Next, after sufficiently displacing the air in the reactor by introducing nitrogen ($N_2$) gas into the reactor for 15 minutes, high purity hydrogen ($H_2$) was introduced as a carrier gas at a flow rate of 9500 cc/min. to stop the flow of $N_2$, and a heating process was then started. After confirming the temperatures at the areas where the quartz port for storing Ga and the GaP single crystal substrate were placed had been maintained constant at 800° and 930°, respectively, vapor-phase growing of a GaAsl-xPx (x=0.9) epitaxial layer having a peak light emitting wavelength of 590±5 nm was started. First, diethyl tellurium (($C_2H_5$)2Te) which is a dopant gas composed of tellurium, an n-type impurity, diluted with hydrogen gas to a concentration of 50 ppm was introduced at a flow rate of 30 cc/min., and high purity hydrogen chloride gas (HCl) was introduced by blowing it into the Ga reservoir of the quartz port at a flow rate of 380 cc/min. and blowing out it from an upper surface of the Ga reservoir to produce GaCl as a Group III component at a rate of 380 cc/min. Simultaneously, hydrogen phosphide ($PH_3$) diluted with $H_2$ to a concentration of 10% was introduced at a flow rate of 1190 cc/min. as a Group V component. With such an arrangement, a GaP layer, a first layer, was grown on the GaP single crystal substrate for 20 minutes. Next, a second GaAsl-xPx (x=0–0.9) epitaxial layer was grown on the first GaP epitaxial layer for 90 minutes by gradually increasing the amount of hydrogen arsenide ($AsH_3$) diluted with $H_2$ to a concentration of 10% introduced from 0 cc/min. to 140 cc/min. and by simultaneously decreasing the temperature of the GaP substrate from 910° C. to 860° C. gradually, with the amounts of the ($C_2H_5$)2Te, HCl and $PH_3$ gases introduced kept unchanged. During the next 30 minutes, a third GaAsl-xPx (x=0.9) epitaxial layer was grown on the second GaAsl-xPx epitaxial layer without changing the amounts of the ($C_2H_5$)2Te, HCl, $PH_3$ and $AsH_3$ gases introduced, i.e., with those amounts kept at 30 cc/min., 380 cc/min., 1190 cc/min. and 140 cc/min., respectively. During the last 50 minutes, a fourth GaAsl-xPx (x=0.9) epitaxial layer was grown on the third GaAsl-xPx epitaxial layer to complete the vapor-phase growth by adding a high purity ammonia gas ($HN_3$) at a flow rate of 320 cc/min. for adding nitrogen (N) for nitrogen isoelectronic traps without changing the amounts of the ($C_2H_5$)2Te, HCl, $PH_3$ and $AsH_3$ gases introduced. The thicknesses of the first, second, third and fourth epitaxial layers were 5 µm, 30 µm, 15 µm and 27 µm, respectively, and the n-type carrier concentration of the fourth epitaxial layer was $1.2 \times 10^{16}$ $cm^{-3}$. Next, a p-n junction was formed at a depth of 6 µm from the surface by diffusing Zn, a p-type impurity, using $ZnA_{S2}$ as a source of diffusion. The sheet resistance of this was 15 $\Omega/cm_2$. Thereafter, processes such as photo-engraving, formation of electrodes using vacuum deposition were performed to form a prismatic light emitting diode of 500 µm×500 µm×180 µm (thickness) having a mesa type p-n junction of a diameter of 180 µm. The initial luminance was 5200 ftL at a current of 15 mA without an epoxy coating. There was no problem in other qualities.

Epitaxial growth was further repeated. As a result, no crack due to sticking was observed in all of 35 wafers produced. The thickness of the epitaxial layer on the rear surface of each epitaxial wafer at the edge toward the upstream of the source gas was approximately 60 µm, and almost no damage due to sticking was observed in such a layer.

A second embodiment of the present invention was the same as the first embodiment except that [011] direction of the GaP substrate was at the upstream side of the source gas.

As a result, no crack due to sticking was observed in all of 12 wafers produced. The thickness of the epitaxial layer on the rear surface of each epitaxial wafer at the edge toward the upstream of the source gas was approximately 50 µm, and almost no damage due to sticking was observed in such a layer.

As an example for comparison, an arrangement was made in the same manner as in the first embodiment except that [01-1] direction of the GaP substrate was at the upstream side of the source gas.

As a result, cracks due to sticking were observed in 5 out of 24 wafers produced. The thickness of the epitaxial layer on the rear surface of each epitaxial wafer at the edge toward the upstream of the source gas was approximately 150 µm, and damages due to sticking were observed in such layers of all the wafers.

According to the present invention, the crystal orientation of a wafer and the direction of a gas flow are optimized to prevent sticking between the epitaxial layer which has been most largely grown at the rear surface of the substrate and the surface of the holder. Needless to say, the same effect can be obtained for epitaxial growth on a GaAs substrate. An epitaxial wafer grown in such a manner can be easily processed later. This makes it possible to improve the yield from an epitaxial process and quality.

Various details of the invention may be changed without departing from its spirit nor its scope. Furthermore, the foregoing description of the embodiments of the present invention is provided for the purpose of explanation only, and not for the purpose of limiting the invention as defined by the appended claims and their equivalents.

What is claimed is:

1. A method of manufacturing a semiconductor wafer by growing a single crystal semiconductor epitaxial layer having a zinc blend structure on a single crystal semiconductor substrate having a zinc blend structure, wherein the surface of said single crystal semiconductor substrate has (100) surface orientation having an off angle and a source gas is supplied in the direction of the off angle or in a direction at 30° or less to the direction of 180° thereto.

2. The method of manufacturing a semiconductor epitaxial wafer according to claim 1, wherein the direction of said off angle is at an angle in the range between 3° and 10° to [0, −1, −1] or [0, 1, 1] direction.

3. The method of manufacturing a semiconductor epitaxial wafer according to claim 1 or claim 2, wherein said single crystal semiconductor substrate is composed of gallium arsenide or gallium phosphide.

4. The method of manufacturing a semiconductor epitaxial wafer according to claim 1, wherein the thickness of said single crystal semiconductor epitaxial layer is 30 μm or more.

5. The method of manufacturing a semiconductor epitaxial wafer according to claim 1, wherein said single crystal semiconductor epitaxial layer is composed of GaAsP.

* * * * *